(12) United States Patent
Koets et al.

(10) Patent No.: US 9,772,777 B2
(45) Date of Patent: Sep. 26, 2017

(54) SYSTEMS AND METHODS FOR IMPROVED ACCESS TO FLASH MEMORY DEVICES

(71) Applicant: Southwest Research Institute, San Antonio, TX (US)

(72) Inventors: Michael A. Koets, San Antonio, TX (US); Larry T. McDaniel, III, San Antonio, TX (US); Miles R. Darnell, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 12 days.

(21) Appl. No.: 14/697,268

(22) Filed: Apr. 27, 2015

(65) Prior Publication Data

US 2016/0313914 A1    Oct. 27, 2016

(51) Int. Cl.
| | | |
|---|---|---|
| G06F 3/06 | (2006.01) |
| G11C 16/32 | (2006.01) |
| G11C 7/10 | (2006.01) |
| G11C 16/06 | (2006.01) |

(52) U.S. Cl.
CPC ............ *G06F 3/061* (2013.01); *G06F 3/0659* (2013.01); *G06F 3/0679* (2013.01); *G11C 7/1039* (2013.01); *G11C 16/06* (2013.01); *G11C 16/32* (2013.01)

(58) Field of Classification Search
CPC ...... G06F 3/061; G06F 3/0659; G06F 3/0688; G06F 3/0679; G11C 16/32; G11C 7/1039; G11C 16/06
See application file for complete search history.

(56) References Cited

U.S. PATENT DOCUMENTS

| | | | |
|---|---|---|---|
| 6,345,000 B1 | 2/2002 | Wong et al. | |
| 6,883,044 B1 | 4/2005 | Roohparvar | |
| 7,061,804 B2 | 6/2006 | Chun et al. | |
| 8,285,917 B2 | 10/2012 | Jullien et al. | |
| 8,364,883 B2 | 1/2013 | Bennett et al. | |
| 2002/0097594 A1* | 7/2002 | Bruce ................. | G06F 12/0804 365/189.16 |
| 2003/0123287 A1* | 7/2003 | Gorobets ............. | G06F 3/0625 365/185.11 |
| 2004/0210729 A1* | 10/2004 | Horii .................... | G11C 7/1042 711/156 |
| 2010/0199025 A1* | 8/2010 | Nanjou ............... | G06F 12/0246 711/103 |
| 2010/0325346 A1* | 12/2010 | Huang ................ | G06F 13/4239 711/103 |
| 2010/0325349 A1* | 12/2010 | Otsuka ................ | G06F 12/0246 711/103 |
| 2011/0035540 A1* | 2/2011 | Fitzgerald ............ | G06F 3/061 711/103 |
| 2015/0067450 A1* | 3/2015 | Ryu ..................... | G06F 3/0619 714/773 |

\* cited by examiner

*Primary Examiner* — Rocio Del Mar Perez-Velez
(74) *Attorney, Agent, or Firm* — Grossman, Tucker et al (57) ABSTRACT

A method and system is provided for improved access to flash memory devices. A system may include a control state module configured to receive memory access commands. The system may further include a plurality of operation sequencer modules configured to execute a pipeline schedule for the performance of the received memory access commands. The pipeline schedule may be configured to enable parallel execution of the memory access commands among a plurality of flash dies of the flash memory. Each of the operation sequencers is associated with one or more of the flash dies.

27 Claims, 8 Drawing Sheets

SYSTEMS AND METHODS FOR IMPROVED ACCESS TO FLASH MEMORY DEVICES

FIELD OF INVENTION

The present disclosure relates to flash memories and flash memory device access, and in particular, to improved data speed transfers to and from flash memory devices.

BACKGROUND

Flash memories provide non-volatile, solid state data storage. NAND flash memories, in particular, provide relatively high storage densities making them suitable for a variety of applications including critical applications such as space applications. The NAND flash memories are generally accessed using commands, such as, for example read, write and erase commands, which operate on blocks or regions of the memory. An interface is typically employed, between the flash memory and an external controller, for example a bus, through which the various access commands may be conveyed. The time required for completion of such operations may vary significantly. For example, read operations may take tens of microseconds, write operations may take hundreds of microseconds and erase operations may take several milliseconds. The interface may present a congestion point (e.g., bus contention) between the flash memory and the external controller, and access inefficiencies may result from delays associated with waiting for the completion of access operations. What is needed, therefore, are improved methods and systems for access to flash memory devices.

SUMMARY

The present disclosure describes methods and systems for improved data speed transfers to and from flash memory devices based on the scheduling of commands to achieve increased parallelization of operations across multiple flash dies within a flash memory device.

In some embodiments, a system is provided for improved access to a flash memory. The system may include one or more operation sequencer modules configured to execute a pipeline schedule for performance of received memory access commands. The pipeline schedule is configured to enable parallel execution of the memory access commands among a plurality of flash dies of the flash memory. The system may also include a plurality of operation generator modules configured to initiate one or more of the memory access commands based on the pipeline schedule. Each of the operation sequencers may be associated with one or more of the flash dies. The system may further include a control state machine configured to accept data storage or retrieval commands, control the behavior of the operation sequencers in order to perform the requested commands, and generate hardware addresses designating the memory locations where data is stored, retrieved, or erased.

In some embodiments, a method is provided for improved access to a flash memory. The method may include receiving memory access commands and executing a pipeline schedule for performance of the memory access commands. The pipeline schedule may be configured to enable parallel execution of the memory access commands among a plurality of flash dies of the flash memory. The method may further include initiating the memory access commands on the flash dies based on the pipeline schedule.

BRIEF DESCRIPTION OF DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION OF PREFERRED EMBODIMENTS

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present disclosure relates to improved access to flash memory devices including increased data transfer speed. The improvements are generally based on the scheduling of commands to achieve increased parallelization of operations across multiple flash dies within a flash memory device. A methodology is provided to address a variety of flash memory applications which may vary significantly in the required storage capacity, access rates, and operational requirements such as simultaneous record and playback, as will be explained herein. This methodology may include scheduling of flash interface operations on a number of flash die and flash devices in order to achieve some desired combination of high rates of read access, high rates of write access, continuous read access, continuous write access, and simultaneously read and write access. Operation scheduling may also be configured to satisfy constraints that preclude the execution of multiple operations on the same flash die at the same time and to avoid simultaneous attempted access to shared interfaces by multiple flash die.

Figure 1:
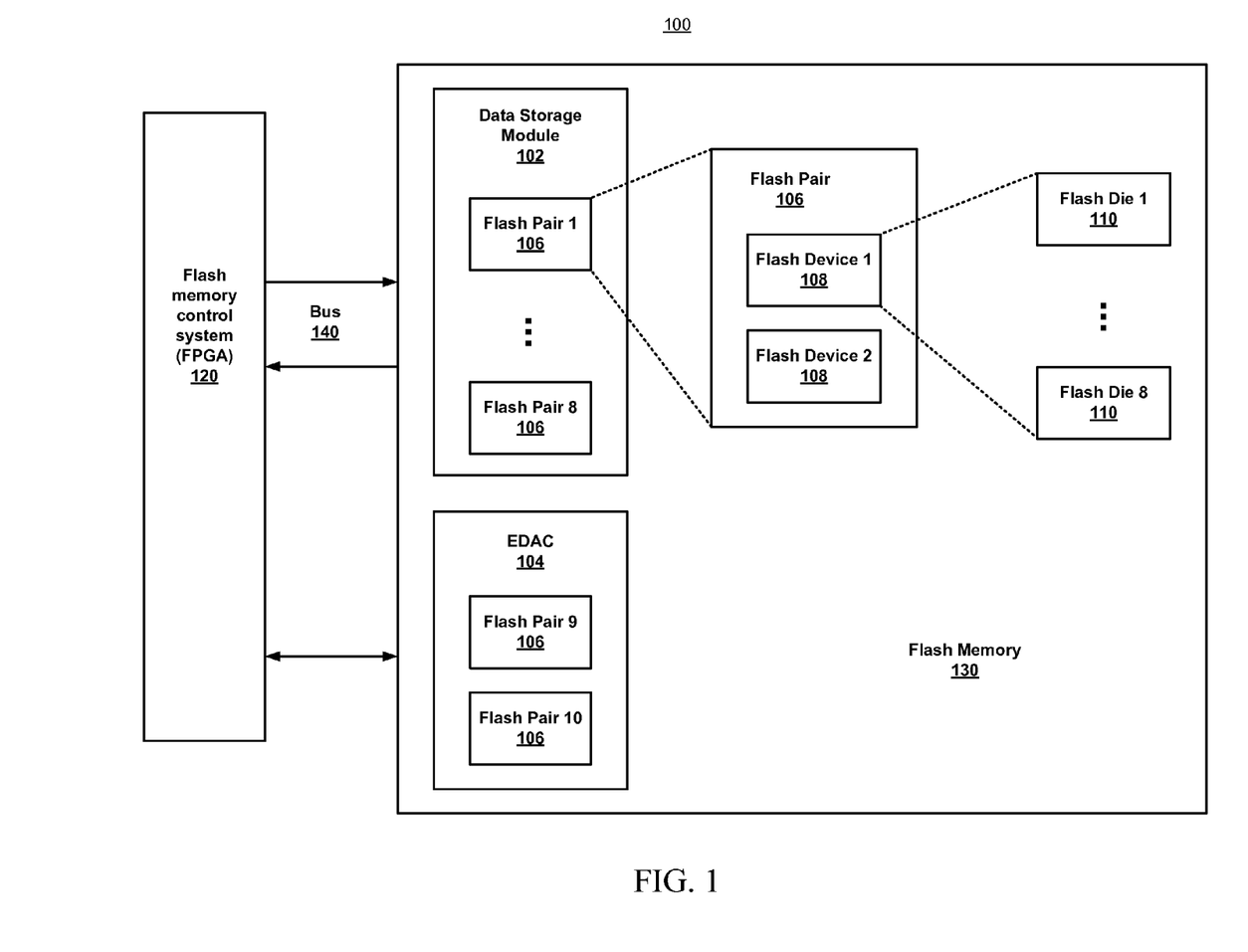
FIG. 1 illustrates a top level system block diagram of one exemplary embodiment consistent with the present disclosure.

Referring now to FIG. 1, there is shown a top level system block diagram 100 of one exemplary embodiment consistent with the present disclosure. A flash memory control system 120 is shown to interface with a flash memory 130 through a bus 140, or other suitable connection. The bus may be a parallel input/output (I/O) bus. In some embodiments, the flash memory control system 120 may be implemented in a Field Programmable Gate Array (FPGA), although any suitable type of circuit, integrated circuit, logic module or other computer system may be used. In some embodiments, the flash memory control system 120 may be configured to be radiation hardened and suitable for operation on a spacecraft. The flash memory 130 is shown to include a hierarchical arrangement of memory components. An example terminology for the various components of the flash memory 130 is introduced, for subsequent use in connection with embodiment descriptions, as follows. A data storage module 102 includes a number of flash pairs 106 (eight flash pairs in this example). Each pair includes two flash devices 108. Each flash device, in turn, includes a number of flash dies 110 (eight in this example). An additional data storage module 104 may be provided for error detection and correction (EDAC), which in this example includes two additional flash pairs 106, the operations of which will be described in greater detail herein.

Figure 2:
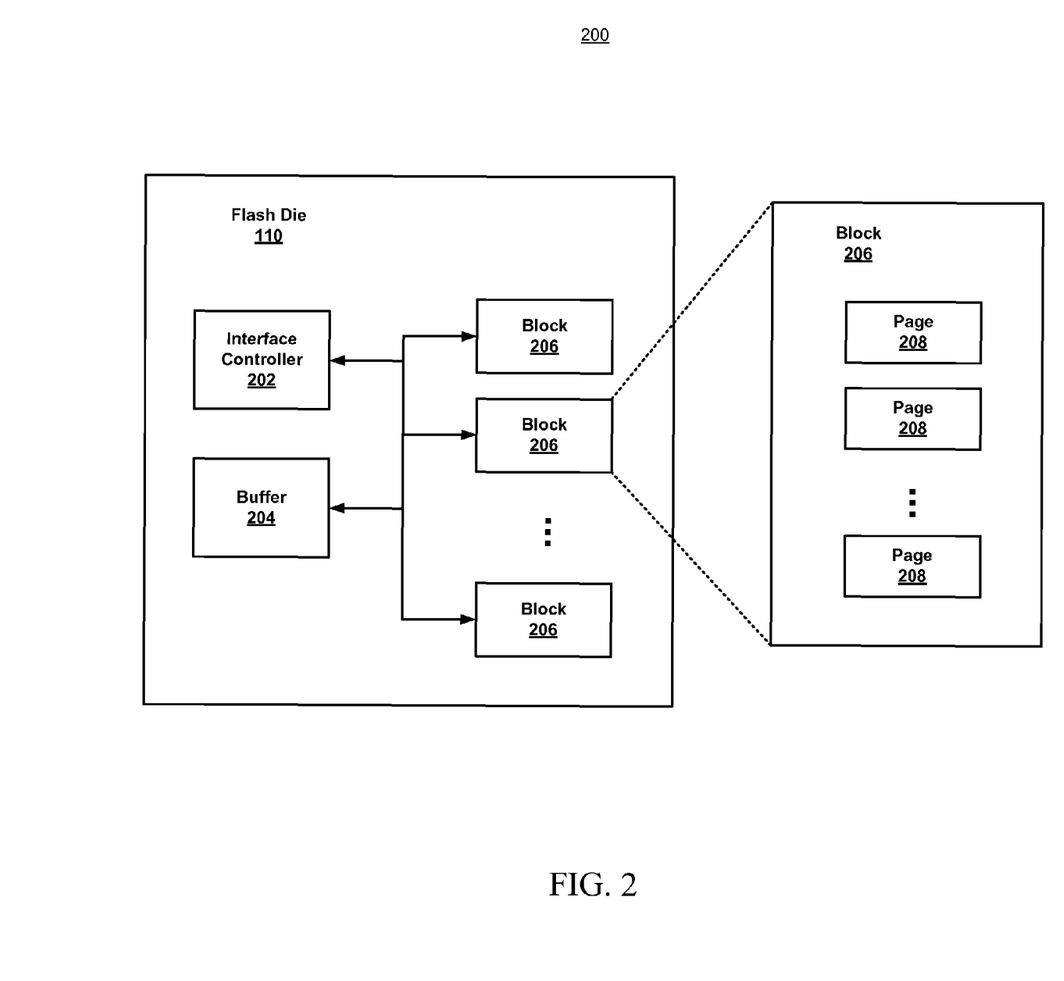
FIG. 2 illustrates a block diagram of a component of one exemplary embodiment consistent with the present disclosure.

With reference now to FIG. 2, it is shown that a flash die 110 may include a number of memory blocks 206 and each block may further include a number of pages 208 of non-volatile memory (NVM). In some embodiments a block 206 may include several tens of pages and a page 208 may be configured to store several Kilobytes of data. The number, and size, of components at each level of the hierarchy may be selected to provide a desired total storage capacity of the flash memory 130. The page 208, however, represents the smallest level of granularity for flash memory access (i.e., a read or write is performed for an entire page rather than a single data item). Erase operations may typically occur at the larger granularity level of a block 206. It will be appreciated that the hierarchy of components within the flash memory 130, shown in FIGS. 1 and 2, is provided as an illustrative example and that, in practice, other configurations are possible including variations in the number of hierarchical levels, the number of components at each level, and the storage size of each component.

The flash die may also include a buffer 204, such as, for example, a random access memory (RAM) buffer, that is configured to provide substantially equal storage capacity to one of the pages 208. Each flash die 110 may be configured to operate in a semi-autonomous fashion, with respect to other components of the flash memory 130, by transferring data between the buffer 204 and one of the pages 208 based on commands received by the flash die's interface controller 202. For example, in connection with a read operation, data may be transferred from a page to the buffer, while, for a write operation, data may be transferred from the buffer to a page. Such transfers, between pages and buffers, may occur simultaneously in some or all of the flash dies. Thus, the semi-autonomous capability enables some operations (or portions of operations) within the flash memory 130 to be performed in parallel, which may increase efficiency.

Flash memory systems of the NAND type generally operate using a command-based interface rather than a memory mapped interface. Command sequences are transferred to the flash memory using a series of byte transfer to and from an external device over a parallel IO bus 140. Commands may include operations such as writing of data into the flash die RAM buffer 204, programming the contents of the buffer 204 to pages 208 within blocks 206, retrieving data from pages 208, reading data from the buffer 204, erasing a block 206, and other miscellaneous operations such as obtaining status information. In some embodiments, the command set used to interface to flash memory is defined by the Open NAND Flash Interface (ONFI) specification.

The flash memory control system 120 may be configured to provide relatively high speed access to numerous flash devices in parallel, typically performing different operations on different flash devices, as will be describe in greater detail. In some embodiments, the operations may be pipelined, that is to say, operational sequences may be performed on multiple flash devices or flash dies 110 with staggered start times. This pipelining may smooth the rate of memory access in order to provide relatively continuous reading and writing of data. The pipelining may also alleviate the problems associated with the shared interface (bus 140) utilized by the numerous dies 110 by reducing contention for the bus. Although each die 110 may be configured to execute some operations independently, such as page programming or block erasure, all of the dies share the bus 140. Improved performance may be obtained, for example, by utilizing the time when one flash die is programming a page or erasing a block, to transfer data to or from another flash die.

It will be appreciated that embodiments of the present disclosure are not limited to providing a solution to any one specific data storage design problem, but rather, provide a methodology to address a variety of flash memory applications which may vary significantly in the required storage capacity, access rates, and operational requirements such as simultaneous record and playback. This methodology may include scheduling of flash interface operations on a number of flash die and flash devices in order to achieve some desired combination of high rates of read access, high rates of write access, continuous read access, continuous write access, and simultaneous read and write access. Operation scheduling may also be configured to satisfy constraints that preclude the execution of multiple operations on the same flash die at the same time and avoid simultaneous attempted access to shared interfaces by multiple flash die.

For example, in an application where read access is of primary importance and the data transfer rate associated with such read access needs to be maximized, the pipeline scheduling may be configured to devote more time to read operations and to focus on minimizing the temporal overlap of read operations on different flash dies 110 to avoid bottlenecks and increase parallelism for those read operations.

Figure 3:
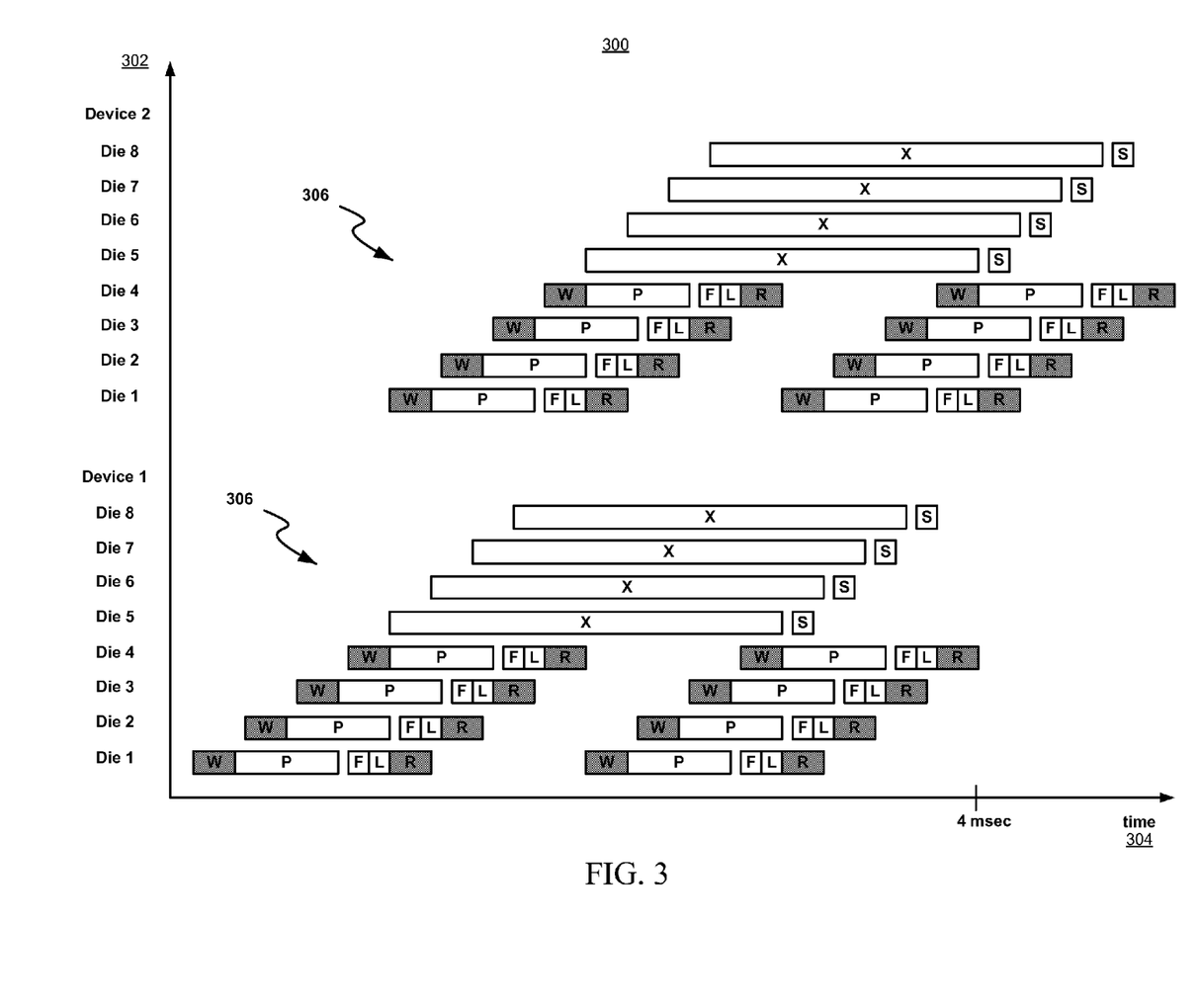
FIG. 3 illustrates a scheduling of operations in accordance with an exemplary embodiment of the present disclosure.

FIG. 3 illustrates one example of a scheduling of operations 300 in accordance with an exemplary embodiment of the present disclosure. The vertical axis 302 designates an ordered listing of eight different flash dies 110 of two different flash devices 108. The horizontal axis designates time 304. A sequence of pipelined operations 306 are shown to be executed for each of the flash dies 110. The operations are designated by a code letter as follows:

W—Write
R—Read
P—Program
X—Erase
L—Load
F—Fetch Request
S—Status check

For example, to write data to the flash memory 130, a write (W) operation first transfers the data from the flash memory control system 120 to the appropriate flash die 110, and then a program (P) operation is performed by the die to transfer the data from the buffer 204 to the appropriate page 208 of NVM. Similarly, to read data from the flash memory 130, a fetch request (F) is issued to the appropriate flash die 110, then a load (L) operation is performed by the die to transfer the data from the appropriate page 208 of NVM to the buffer 204, and then a read (R) operation transfers the data from the buffer 204 back to the flash memory control system 120.

Write (W) and read (R) operations generally involve the transfer of data between the flash memory control system 120 and the flash memory 130 over the shared bus 140. These operations, which are shaded in gray, compete for the limited bus resource and may therefore cause delays. Program (P), erase (X) and load (L) operations may generally be performed autonomously by the flash die 110 without reliance on the bus 140, and therefore provide opportunities for performance enhancing parallelism. Fetch request (F) and status (S) operations generally consume relatively little time and are therefore not of great concern.

The schedule of pipelined operations 300 is configured to reduce temporal overlap between read and write operations associated with different dies to the extent possible, or practical, and to achieve a desired data storage capacity and transfer rate. The schedule is also arranged so that read (R) and write (W) operations (that consume bus bandwidth) on one set of dies, occur in parallel with autonomous program (P), erase (X) and load (L) operations on another set of dies.

The schedule in this example is also designed to provide relatively continuous writing of data to flash memory and readout of data from flash memory. Write and read operations are sequenced over 8 flash dies on 2 flash devices, but both writing of data and readout of data occur relatively continuously (i.e., no extra delay is introduced between successive write operations or successive read operations). This is in contrast to one of the examples illustrated below. Also, in this example, the rate of data writing and the rate of data readout are the same. That is to say, the number and size of write and read operations per unit of time is substantially the same. Although the timescale shown in this illustration is on the order of 4 to 5 milliseconds, it will be appreciated that in practice any data rate may be used depending on the characteristics of the flash memory and thus time scales would vary.

Figure 4:
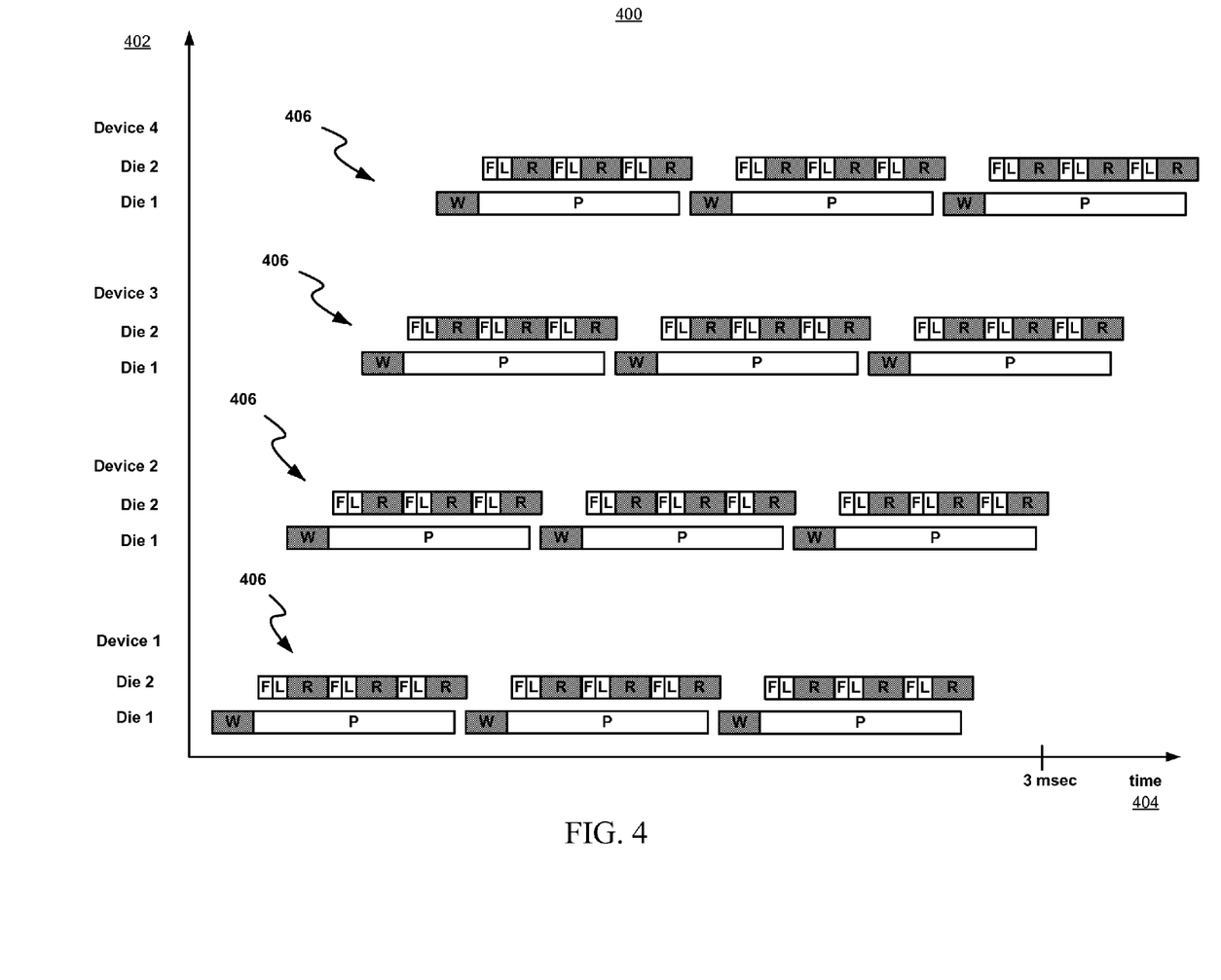
FIG. 4 illustrates a scheduling of operations in accordance with another exemplary embodiment of the present disclosure.

FIG. 4 illustrates a scheduling of operations 400 in accordance with another exemplary embodiment of the present disclosure. Similar to FIG. 3, the vertical axis 402 designates an ordered listing of two different flash dies 110 of four different flash devices 108. The horizontal axis designates time 404. A sequence of pipelined operations 406 are shown to be executed for each of the flash dies 110. This schedule operates on 2 flash dies in each of four flash devices and provides continuous write access and continuous read access as in the previous example, though on a smaller number of dies. In this example, however, readout of data is given priority over writing of data. Data is read from the flash at a rate three times higher than it is written.

Figure 5:
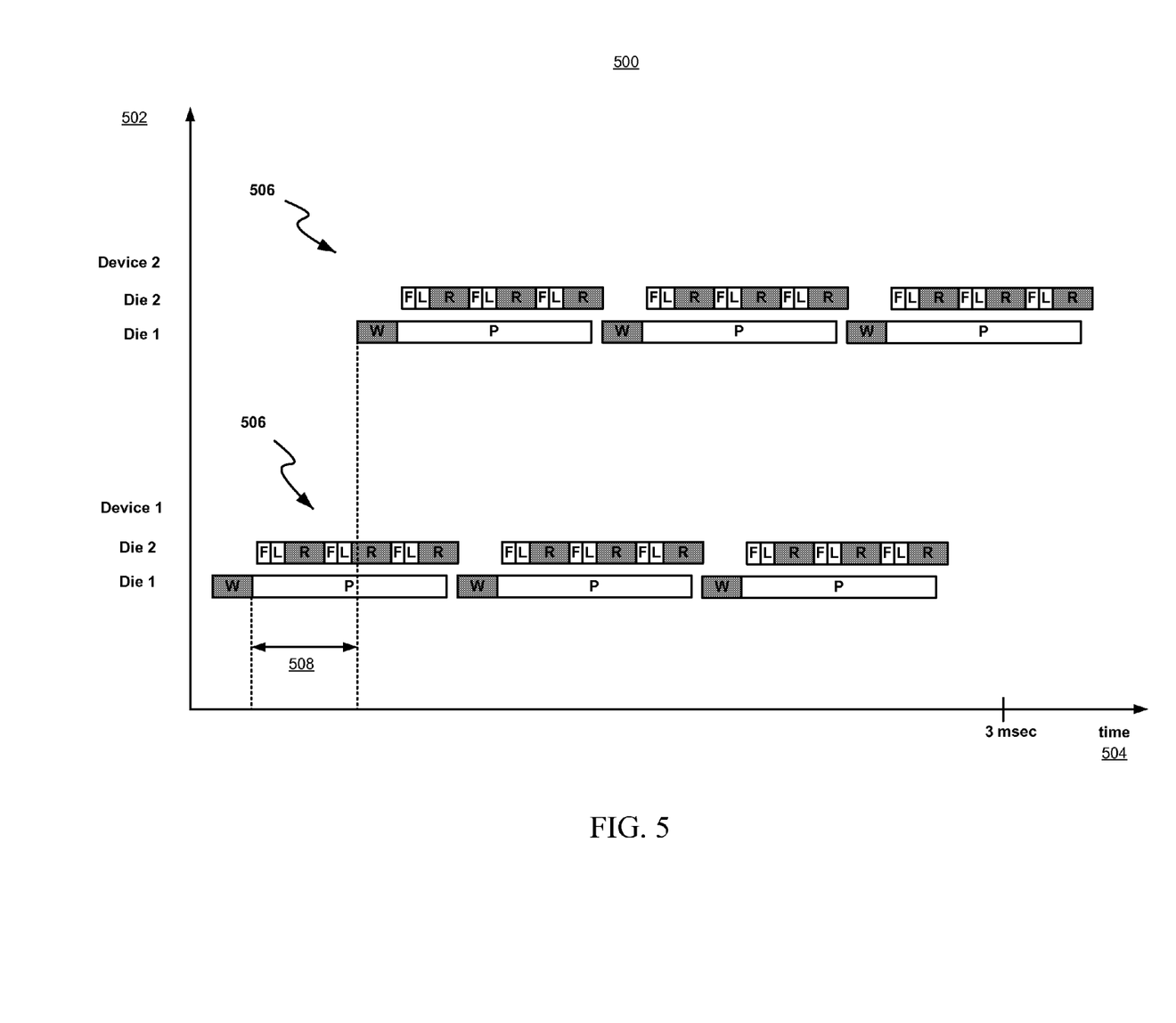
FIG. 5 illustrates a scheduling of operations in accordance with another exemplary embodiment of the present disclosure.

FIG. 5 illustrates a scheduling of operations 500 in accordance with another exemplary embodiment of the present disclosure. Similar to FIGS. 3 and 4, the vertical axis 502 designates an ordered listing of two different flash dies 110 of two different flash devices 108. The horizontal axis designates time 504. A sequence of pipelined operations 506 are shown to be executed for each of the flash dies 110. This schedule operates on 2 flash dies in each of two flash devices. Data readout is continuous but writing of data is periodically interrupted, as shown by the time delay 508 which is introduced between writes to the first device and the second device. The read data rate is three times that of the write data rate, as in the example of FIG. 4, but overall data rates are lower, due to the time delay 508. This example illustrates the application to a case where lower data rates are required or where fewer flash devices are employed relative to the design of FIG. 4.

Although three examples of pipelined schedules are illustrated herein, it will be appreciated that the number of scheduling possibilities are limitless by varying any of a number of factors including, for example: the sequence of operations, timing of operations, data rates, number of dies and devices, delays, etc.

Figure 6:
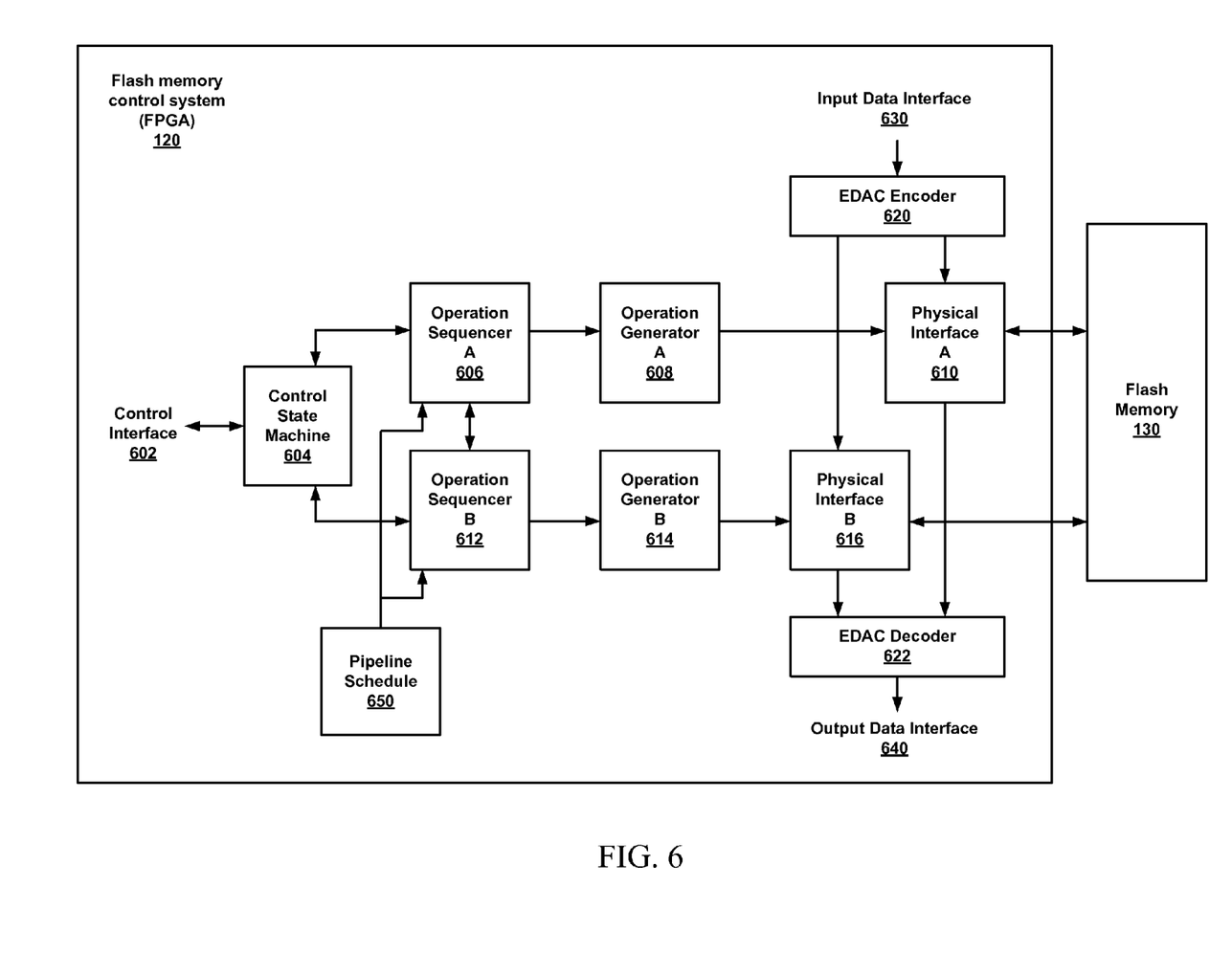
FIG. 6 illustrates a block diagram of another component of one exemplary embodiment consistent with the present disclosure.

FIG. 6 illustrates a block diagram 600 of another component of one exemplary embodiment consistent with the present disclosure. The flash memory control system 120 is shown in greater detail to include a control state machine 604 and two parallel pipelines (designated A and B). The pipelines may include operation sequencer modules 606, 612, operation generator modules 608, 614, and physical interface modules 610, 616. Although two pipelines are illustrated, in general any number of pipelines may be employed, for example depending on the size and configuration of the flash memory 130. Each pipeline may be associated with one or more of the flash dies 110. The flash memory control system 120 may also include an EDAC encoder module 620 and an EDAC decoder module 622, as will be described in greater detail.

The control state machine 604 may be configured to receive memory access commands, for example through control interface 602. The received commands may include for example, commands to read data from, write data to, or erase regions of the flash memory 130. The data to be written may be supplied through an input data interface 630, and the data that is read may be delivered through an output data interface 640. The control state machine 604 may further be configured to coordinate the operations of two or more operation sequencers 606, 612 including for example setting the modes of operation of the sequencers and, in some embodiments, synchronizing the execution times of the operation sequencers, in order to perform the received memory access commands. Modes of operation may include, for example, record only mode, playback only mode, simultaneous record and playback mode, and erase mode. The control state machine 604 may also provide a sequence of hardware addresses designating the physical locations in the flash memory where data is to be stored, retrieved, or erased.

The operation sequencer modules 606, 612 may be configured to initiate one or more of the memory access commands based on the pipelined schedule 650 provided. Each of the operation sequencers may be associated with one or more of the flash dies. The schedule 650, which is typically designed in advance based on the size and type of memory device and the particular access requirements of the memory device application, may be stored or otherwise coded on the FPGA 120 for provisioning to the operation sequencer modules 606, 612. The pipeline schedule 650 may be configured to enable parallel execution of at least some of the operations associated with these commands among a number of flash dies 110 of the flash memory 130. The operation sequencer modules 606, 612 may further be configured to synchronize operations between the parallel pipelines A and B. Synchronizing may include, for example, setting and maintaining the starting times of operation on each pipeline relative to all other pipelines. The operation generator modules 608, 614 may be configured to translate the memory access commands into a byte stream or other format that is compatible with the flash memory 130.

The EDAC encoder 620 and EDAC decoder 622 may be configured to provide error detection and correction on the data being transferred into and out of the flash memory 130. For example, EDAC encoder 620 may generate error correction codes (ECCs) based on the incoming data and store these codes in the EDAC portion 104 of the flash memory 130. Likewise, EDAC decoder 622 may check the ECCs, while reading data out of the flash, to determine if an error exists and to correct it if possible.

Physical interface modules 610, 616 may be configured to communicate the (translated) memory access commands and data between the flash memory control system 120 and the flash memory 130 over the bus 140. In some embodiments, this may involve multiplexing, sampling, and driving electrical signals at appropriate levels, as known in the art.

Figure 7:
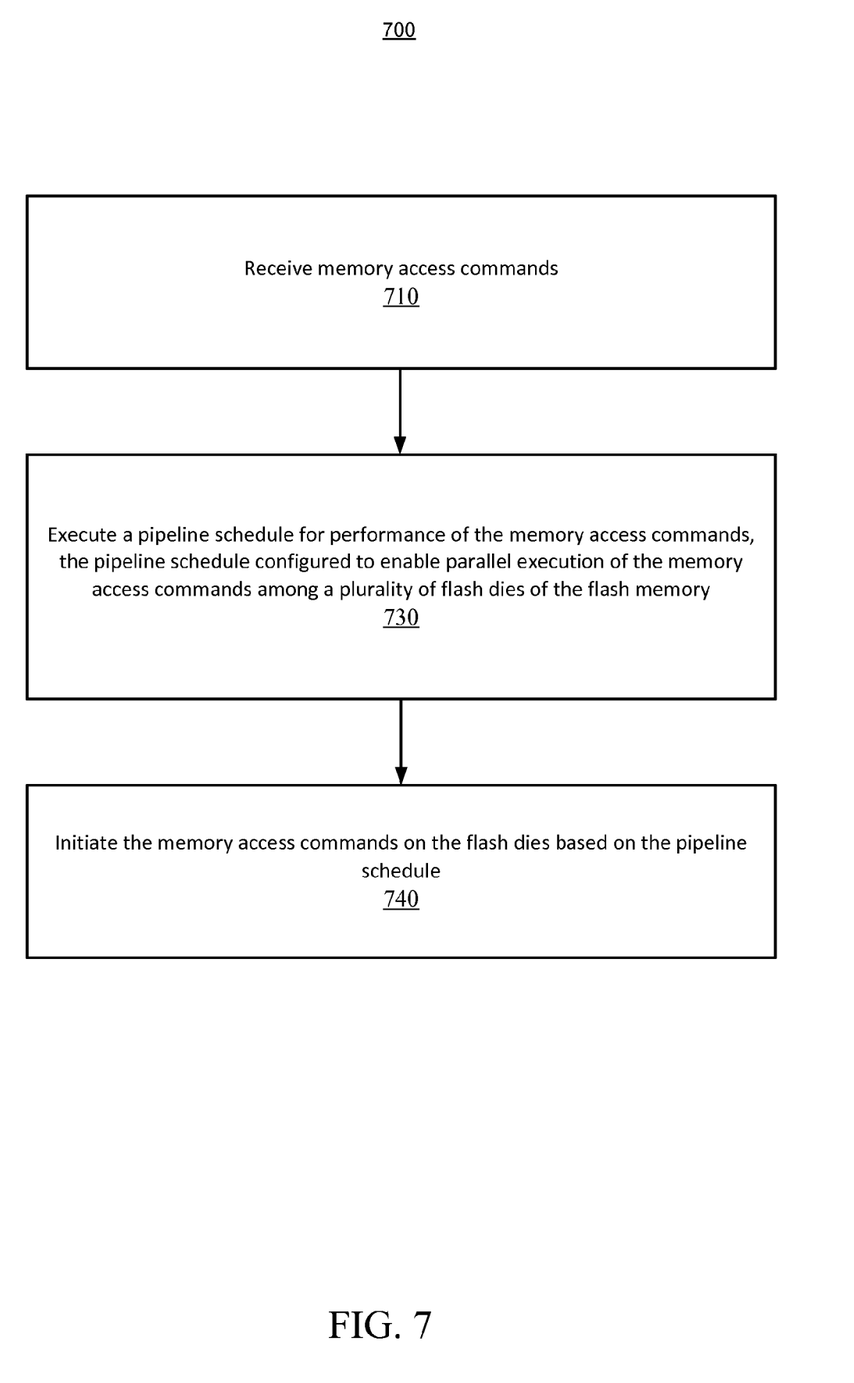
FIG. 7 illustrates a flowchart of operations of another exemplary embodiment consistent with the present disclosure.

FIG. 7 illustrates a flowchart of operations 700 of another exemplary embodiment consistent with the present disclosure. At operation 710, memory access commands are received. At operation 720, a pipeline schedule is executed for performance of the memory access commands. The pipeline schedule is configured to enable parallel execution of the memory access commands among a plurality of flash dies of the flash memory. At operation 730, the memory access commands are initiated on the flash dies based on the pipeline schedule.

In view of the foregoing, it may be appreciated that the present disclosure also relates to an article comprising a non-transitory storage medium having stored thereon instructions that when executed by a machine result in the performance of the steps of the methods as described in the examples above such as, for example, in connection with the description associated with FIG. 7. In some embodiments, the method operations may be implemented in software and executed by a processor or may be implemented in hardware such as, for example, an application specific integrated circuit (ASIC) or field programmable gate array (FPGA).

Figure 8:
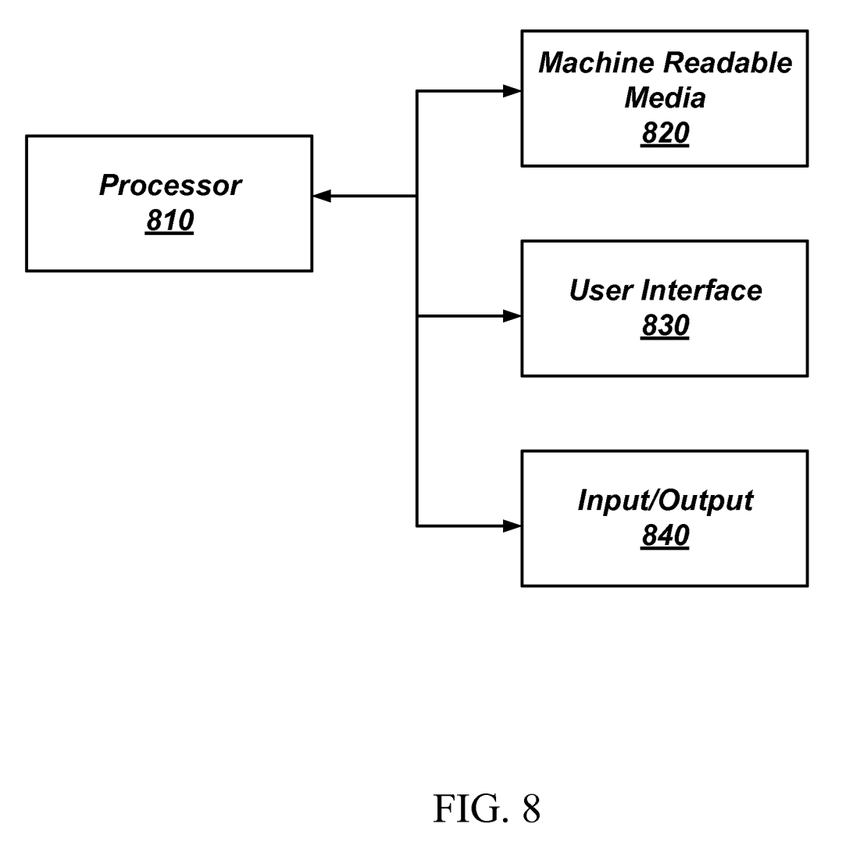
FIG. 8 illustrates a processor, machine readable media, user interface and sensor input that may be employed in an exemplary embodiment consistent with the present disclosure.

It should also be appreciated that the functionality described herein for the embodiments of the present invention may therefore be implemented by using hardware, software, or a combination of hardware and software, as desired. If implemented by software, a processor and a machine readable medium are required. The processor may be any type of processor capable of providing the speed and functionality required by the embodiments of the invention. Machine-readable memory includes any non-transitory media capable of storing instructions adapted to be executed by a processor. Non-transitory media include all computer-readable media with the exception of a transitory, propagating signal. Some examples of such memory include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g., floppy disk and hard drive), optical disk (e.g. CD-ROM), and any other device that can store digital information. The instructions may be stored on a medium in either a compressed and/or encrypted format. Accordingly, in the broad context of the present invention, and with attention to FIG. 8, the system and method for the herein disclosed improved flash memory access may be accomplished with a processor (810), machine readable media (820), user interface (830) and sensor input (840).

Thus the present disclosure provides methods and systems for improved flash memory access. According to one aspect there is provided a method. The method may include receiving memory access commands and executing a pipeline schedule for performance of the memory access commands. The pipeline schedule may be configured to enable parallel execution of the memory access commands among a plurality of flash dies of the flash memory. The method may further include initiating the memory access commands on the flash dies based on the pipeline schedule.

According to another aspect there is provided a system. The system may include a control state module configured to receive memory access commands. The system may also include a plurality of operation sequencer modules configured to execute a pipeline schedule for performance of the received memory access commands. The pipeline schedule may be configured to enable parallel execution of the memory access commands among a plurality of flash dies of the flash memory. Each of the operation sequencers may be associated with one or more of the flash dies.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A system for improved access to a flash memory, said system comprising:
   control state circuitry to receive memory access commands;
   at least a first and a second operation sequencer circuit, each operation sequencer circuit associated with one or more flash memory die of said flash memory and configured to sequence execution of said memory access commands based on a pipeline schedule for performance of said received memory access commands, said pipeline schedule configured to cause, over a given time T, the first and second operation sequencer circuit to perform parallel execution of a first type of said memory access commands on said associated one or more flash memory die, and while parallel execution of the first type of said memory access commands occur, perform sequential execution of a second type of said memory access commands, wherein only one of said first and second operation sequencer circuits performs execution of said second type of said memory access commands at a time during time T; and
   an operation generator module associated with each of said operation sequencer, said operation generator module configured to translate said memory access commands to a format compatible with said flash memory.

2. The system of claim 1, wherein said second type of memory access commands comprise a read command and/or a write command.

3. The system of claim 1, wherein said first type of memory access commands comprise at least one of erase command and/or block erasure command.

4. The system of claim 1, wherein during said parallel execution of said first type of memory access commands, performance at least one of said first type of memory commands overlaps temporally with performance of said sequential execution of said second type of memory access command during time T.

5. The system of claim 1, wherein said parallel execution of said first type of memory access commands comprises an operation of erasing one of said flash dies, said operation temporally overlapping with an operation of reading to or writing from another of said flash dies.

6. The system of claim 1, wherein said pipeline schedule is configured to increase read access data rates.

7. The system of claim 1, wherein said pipeline schedule is configured to increase write access data rates.

8. The system of claim 1, wherein said pipeline schedule is configured to provide continuous read access or continuous write access.

9. The system of claim 1, wherein said pipeline schedule is configured to interrupt performance of write operations to increase read operation performance.

10. The system of claim 1, wherein said system is implemented in a Field Programmable Gate Array (FPGA).

11. The system of claim 1, further comprising a data bus, said data bus being a shared interface to communicate with each die of said flash memory, and wherein performance of the first type of memory access commands and the second type of memory access commands on said flash memory occurs via said shared interface.

12. A method for improved access to a flash memory, said method comprising:
  receiving memory access commands;
  translating said memory access commands to a format compatible with said flash memory;
  executing a pipeline schedule for performance of said memory access commands, said pipeline schedule configured to cause, over a given time T, parallel execution of a first type of said memory access commands on one or more flash memory die associated with said flash memory, and while parallel execution of the first type of said memory access commands occur, sequentially executing a second type of said memory access commands, wherein only one of said second type of said memory access commands is performed at a time during time T; and
  initiating said memory access commands on said flash dies based on said pipeline schedule.

13. The method of claim 12, wherein said second type of memory access commands comprise a read command and/or a write command.

14. The method of claim 12, wherein said first type of memory access commands comprise at least one of erase command and/or block erasure command.

15. The method of claim 12, wherein during said parallel execution of said memory access commands, performing at least one of said first type of memory commands overlaps temporally with performance of said sequential execution of said second type of memory access command during time T.

16. The method of claim 12, wherein said pipeline schedule is configured to increase read access data rates.

17. The method of claim 12, wherein said pipeline schedule is configured to increase write access data rates.

18. The method of claim 12, wherein said pipeline schedule is configured to provide continuous read access or continuous write access.

19. The method of claim 12, wherein said pipeline schedule is configured to interrupt performance of write operations to increase read operation performance.

20. An article comprising a non-transitory storage medium having stored thereon instructions that when executed by a machine result in the following operations:
  receiving memory access commands;
  translating said memory access commands to a format compatible with flash memory;
  executing a pipeline schedule for performance of said memory access commands, said pipeline schedule configured to cause, over a given time T, parallel execution of a first type of said memory access commands on one or more flash memory die associated with said flash memory, and while parallel execution of the first type of said memory access commands occur, sequentially executing a second type of said memory access commands, wherein only one of said second type of said memory access commands is performed at a time during time T; and
  initiating said memory access commands on said flash dies based on said pipeline schedule.

21. The article of claim 20, wherein said second type of memory access commands comprise a read command and/or a write command.

22. The article of claim 20, wherein said first type of memory access commands comprise at least one of erase command and/or block erasure command.

23. The article of claim 20, wherein during said parallel execution of said memory access commands, performance of at least one of said first type of memory commands overlaps temporally with performance of said sequential execution of said second type of memory access command during time T.

24. The article of claim 20, wherein said pipeline schedule is configured to increase read access data rates.

25. The article of claim 20, wherein said pipeline schedule is configured to increase write access data rates.

26. The article of claim 20, wherein said pipeline schedule is configured to provide continuous read access or continuous write access.

27. The article of claim 20, wherein said pipeline schedule is configured to interrupt performance of write operations to increase read operation performance.

* * * * *